US012413210B2

(12) United States Patent
Li

(10) Patent No.: US 12,413,210 B2
(45) Date of Patent: Sep. 9, 2025

(54) CONTROL CIRCUIT WITH HYSTERESIS CONTROL FOR SWITCHING CONVERTERS AND CONTROL METHOD THEREOF

(71) Applicant: Chengdu Monolithic Power Systems Co., Ltd., Chengdu (CN)

(72) Inventor: Lei Li, Chengdu (CN)

(73) Assignee: Chengdu Monolithic Power Systems Co., Ltd., Sichuan (CN)

( * ) Notice: Subject to any disclaimer, the term of this patent is extended or adjusted under 35 U.S.C. 154(b) by 165 days.

(21) Appl. No.: 18/449,181

(22) Filed: Aug. 14, 2023

(65) Prior Publication Data

US 2023/0387892 A1 Nov. 30, 2023

(30) Foreign Application Priority Data

Aug. 22, 2022 (CN) .......................... 202211006883.8

(51) Int. Cl.
*H03K 3/02* (2006.01)
*H02M 1/00* (2006.01)
*H02M 3/158* (2006.01)
*H03K 3/0233* (2006.01)

(52) U.S. Cl.
CPC ...... *H03K 3/02337* (2013.01); *H02M 1/0025* (2021.05); *H02M 3/158* (2013.01)

(58) Field of Classification Search
None
See application file for complete search history.

(56) References Cited

U.S. PATENT DOCUMENTS

| | | | |
|---|---|---|---|
| 5,998,945 A * | 12/1999 | Elliott | H02P 25/0925 318/254.1 |
| 7,116,089 B1 | 10/2006 | Nguyen et al. | |
| 8,138,734 B2 | 3/2012 | Xi et al. | |
| 8,928,300 B2 | 1/2015 | Xi et al. | |
| 8,941,367 B2 | 1/2015 | Li et al. | |
| 9,774,253 B2 | 9/2017 | Xu | |
| 9,891,648 B2 | 2/2018 | Li | |
| 9,979,288 B2 | 5/2018 | Mao et al. | |
| 10,666,272 B2 | 5/2020 | Li | |
| 2013/0077359 A1* | 3/2013 | Lindemann | H02M 1/44 363/39 |
| 2013/0127430 A1* | 5/2013 | Leung | H02M 3/157 323/282 |
| 2019/0190377 A1* | 6/2019 | Santiago | H02M 3/156 |

* cited by examiner

*Primary Examiner* — Rafael O De Leon Domenech
(74) *Attorney, Agent, or Firm* — Perkins Coie LLP

(57) ABSTRACT

A controller for a switching converter has a hysteresis generating circuit to provide an upper hysteresis limit and a lower hysteresis limit based on an output voltage, a switching control circuit for providing a switching control signal, and a frequency locking circuit for adjusting one of the upper hysteresis limit and the lower hysteresis limit based on the switching control signal and a clock signal. When the switching converter is in a first mode, a main switch of the switching converter is turned ON by comparing a current sense signal representative of a current flowing through the main switch with the lower hysteresis limit, and is turned OFF by comparing the current sense signal with the upper hysteresis limit. When the switching converter is in a second mode, the main switch is turned ON based on the clock signal, and is turned OFF based on the current sense signal.

19 Claims, 5 Drawing Sheets

CONTROL CIRCUIT WITH HYSTERESIS CONTROL FOR SWITCHING CONVERTERS AND CONTROL METHOD THEREOF

CROSS-REFERENCE TO RELATED APPLICATIONS

This application claims the benefit of CN application 202211006883.8, filed on Aug. 22, 2022, and incorporated herein by reference.

BACKGROUND OF THE INVENTION

1. Field of the Invention

The present invention generally relates to electronic circuits, and more particularly, relates to control circuits for voltage regulators and control methods thereof.

2. Description of Related Art

Fixed frequency peak current control is widely used in switching converters. With a fixed frequency peak current control, a reference voltage and a feedback signal representative of an output voltage of a switching converter are sent into an error amplifier to generate a compensation signal. A main switch of the switching converter is turned ON by a clock signal, and is turned OFF when a current sense signal representative of a current flowing through the main switch increases to be larger than the compensation signal. Owing to an inherent delay of the control circuit, there exists a minimum ON time period for the main switch, i.e., the main switch can be turned OFF only after its ON time period reaches the minimum ON time period.

If the input voltage of the switching converter keeps increasing, the ON time period of the main switch will decrease until it reaches the minimum ON time period, and the ON time period of the main switch cannot be further decreased. As a result, the output voltage of the switching converter will go up with the input voltage, and a large ripple would arise on the output voltage accordingly.

SUMMARY OF THE INVENTION

It is an object of the present invention to provide a controller for a switching converter.

Embodiments of the present invention are directed to a controller for a switching converter. The switching converter comprises a main switch. The controller comprises a hysteresis generating circuit, a switching control circuit, and a frequency locking circuit. The hysteresis generating circuit, configured to provide an upper hysteresis limit and a lower hysteresis limit based on an output voltage of the switching converter. The switching control circuit is configured to provide a switching control signal to control the main switch. The frequency locking circuit, configured to adjust one of the upper hysteresis limit and the lower hysteresis limit based on the switching control signal and a clock signal. In response to a first mode of the switching converter, the switching control circuit is configured to turn the main switch ON by comparing a current sense signal representative of a current flowing through the main switch with the lower hysteresis limit, and to turn the main switch OFF by comparing the current sense signal with the upper hysteresis limit. In response to a second mode of the switching converter, the switching control circuit is configured to turn the main switch ON based on the clock signal, and to turn the main switch OFF based on the current sense signal.

Embodiments of the present invention are directed to a controller for a switching converter. The switching converter comprises a main switch. The controller comprises a hysteresis generating circuit and a switching control circuit. The hysteresis generating circuit is configured to provide an upper hysteresis limit and a lower hysteresis limit based on an output voltage of the switching converter. The switching control circuit is coupled to the hysteresis generating circuit, and is configured to provide a switching control signal based on a current sense signal representative of a current flowing through the main switch, the upper hysteresis limit, and the lower hysteresis limit to turn ON and OFF the main switch. In response to a first mode of the switching converter, the switching control circuit is configured to turn the main switch OFF by comparing the current sense signal with the upper hysteresis limit, and to turn the main switch ON by comparing the current sense signal with the lower hysteresis limit. One of the upper hysteresis limit and the lower hysteresis limit is adjusted such that a difference between the upper hysteresis limit and the lower hysteresis limit is adjusted according to a frequency of the switching control signal.

Embodiments of the present invention are directed to a control method for a switching converter. The switching converter comprises a main switch. The control method comprises providing an upper hysteresis limit and a lower hysteresis limit based on an output voltage of the switching converter, providing a switching control signal based on a current sense signal representative of a current flowing through the main switch, the upper hysteresis limit, and the lower hysteresis limit to turn ON and OFF the main switch in response to a first mode of the switching converter, and adjusting one of the upper hysteresis limit and the lower hysteresis limit based on the switching control signal. Wherein the main switch is turned OFF by comparing the current sense signal with the upper hysteresis limit, and is turned ON by comparing the current sense signal with the lower hysteresis limit.

These and other features of the present invention will be readily apparent to persons of ordinary skill in the art upon reading the entirety of this disclosure, which includes the accompanying drawings and claims.

BRIEF DESCRIPTION OF DRAWINGS

The present invention can be further understood with reference to the following detailed description and the appended drawings, wherein like elements are provided with like reference numerals.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
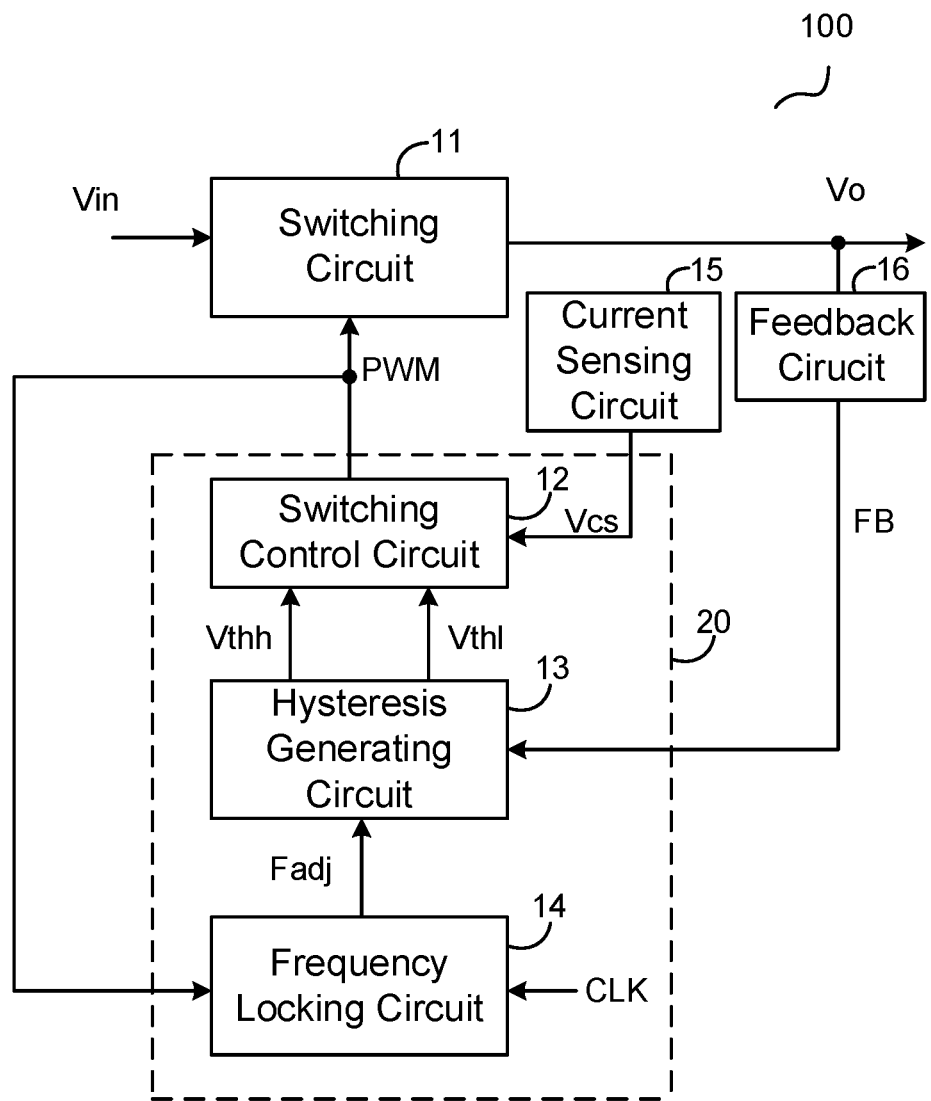
FIG. 1 schematically shows a block diagram of a switching converter 100 in accordance with an embodiment of the present invention.

FIG. 1 schematically shows a block diagram of a switching converter 100 in accordance with an embodiment of the present invention. In the example of FIG. 1, the switching converter 100 comprises a switching circuit 11, a controller 20, a current sensing circuit 15, and a feedback circuit 16. The switching circuit 11 comprises a main switch, and is configured to convert an input voltage Vin into an output voltage Vo. The switching circuit 11 may comprise any suitable topologies, such as buck, boost, buck-boost, flyback, etc. The feedback circuit 16 is coupled to the switching circuit 11 to provide a feedback signal FB based on the output voltage Vo. The current sensing circuit 15 provides a current sense signal Vcs based on a current flowing through the main switch.

The controller 20 comprises a switching control circuit 12, a hysteresis generating circuit 13, and a frequency locking circuit 14. The hysteresis generating circuit 13 provides an upper hysteresis limit Vthh and a lower hysteresis limit Vthl based on the output voltage Vo. The switching control circuit 12 provides a switching control signal PWM to control the main switch. In one embodiment, the switching control circuit 12 is coupled to the hysteresis generating circuit 13, and provides the switching control signal PWM based on the current sense signal Vcs, the upper hysteresis limit Vthh and the lower hysteresis limit Vthl to turn ON and OFF the main switch. In one embodiment, the main switch is turned OFF by comparing the current sense signal Vcs with the upper hysteresis limit Vthh, and is turned ON by comparing the current sense signal Vcs with the lower hysteresis limit Vthl. In another embodiment, when the switching converter 100 is in a first mode, the switching control circuit 12 turns the main switch ON by comparing the current sense signal Vcs with the lower hysteresis limit Vthl, and turns the main switch OFF by comparing the current sense signal Vcs with the upper hysteresis limit Vthh; and when the switching converter 100 is in a second mode, the switching control circuit 12 turns the main switch ON based on a clock signal CLK, and turns the main switch OFF based on the current sense signal Vcs. The first mode comprises situations of the input voltage varying. For example, the first mode may comprise but not limited to a startup process of the switching converter 100. The second mode comprises situations of the input voltage kept unchanged. For example, the second mode may comprise but not limited to a normal operation after the startup process of the switching converter 100. The switching converter 100 in accordance with the embodiments of the present invention can smoothly transit between the first mode and the second mode without a sudden change or jitter of a switching frequency or the output voltage Vo of the switching converter 100. The frequency locking circuit 14 adjusts one of the upper hysteresis limit Vthh and the lower hysteresis limit Vthl based on the switching control signal PWM and the clock signal CLK, and thus controls a frequency of the switching control signal PWM equal to a frequency of the clock signal CLK. In one embodiment, the frequency locking circuit 14 provides a hysteresis adjustment signal Fadj to adjust one of the upper hysteresis limit Vthh and the lower hysteresis limit Vthl based on a difference between the frequency of the switching control signal PWM and the frequency of the clock signal CLK.

When the input voltage Vin varies significantly, the switching converter 100 in accordance with the embodiments of the present invention can prevent an ON time period of the main switch from being reduced to a minimum ON time period, thereby stabilizing the output voltage Vo, and can also keep the switching frequency basically constant to reduce electromagnetic interference.

Figure 2:
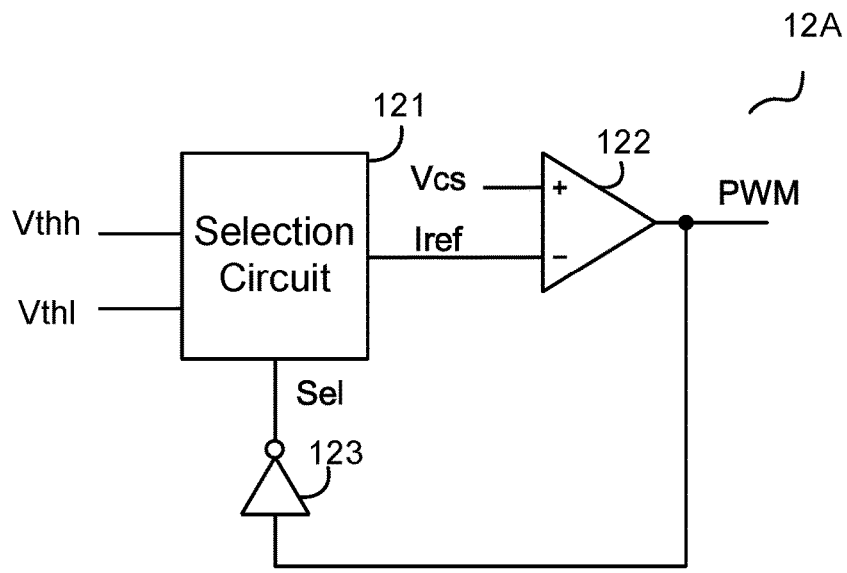
FIG. 2 schematically illustrates a circuit diagram of a switching control circuit 12A in accordance with an embodiment of the present invention.

FIG. 2 schematically illustrates a circuit diagram of the switching control circuit 12A in accordance with an embodiment of the present invention. In the embodiment of FIG. 2, the switching control circuit 12A comprises a selection circuit 121 and a comparison circuit 122. The selection circuit 121 receives the upper hysteresis limit Vthh, the lower hysteresis limit Vthl, and a selection signal Sel. The selection circuit 121 selects one of the upper hysteresis limit Vthh and the lower hysteresis limit Vthl as a current reference signal Iref according to the selection signal Sel. In one embodiment, the selection signal Sel is generated based on the switching control signal PWM. The comparison circuit 122 provides the switching control signal PWM by comparing the current sense signal Vcs with the current reference signal Iref. In one embodiment, when the switching control signal PWM controls the main switch to remain OFF, the lower hysteresis limit Vthl is selected as the current reference signal Iref based on the selection signal Sel, and the comparison circuit 122 provides the switching control signal PWM to turn the main switch ON by comparing the current sense signal Vcs with the lower hysteresis limit Vthl. In one embodiment, when the switching control signal PWM controls the main switch to remain ON, the upper hysteresis limit Vthh is selected as the current reference signal Iref based on the selection signal Sel, and the comparison circuit 122 provides the switching control signal PWM to turn the main switch OFF by comparing the current sense signal Vcs with the upper hysteresis limit Vthh. In the example of FIG. 2, the comparison circuit 122 comprises a first input terminal to receive the current sense signal Vcs, a second input terminal to receive the current reference signal Iref, and an output terminal to provide the switching control signal PWM. In one embodiment, the selection signal Sel is an inverted signal of the switching control signal PWM. For example, an inverter 123 receives the switching control signal PWM, and provides the selection signal Sel by inverting the switching control signal PWM.

Figure 3:
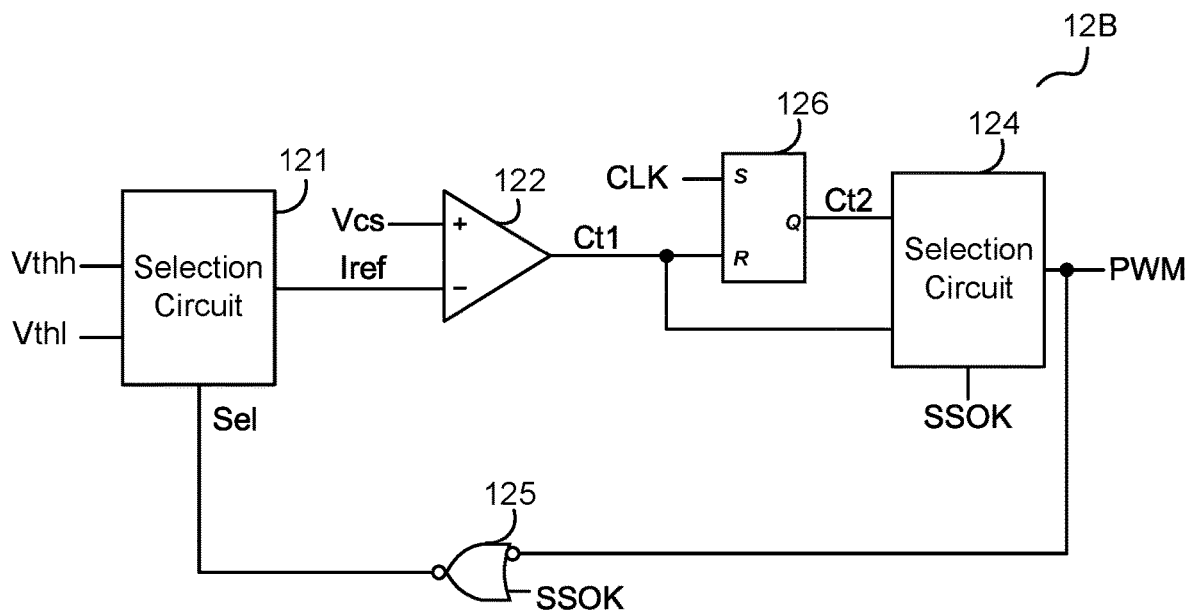
FIG. 3 schematically illustrates a circuit diagram of the switching control circuit 12B in accordance with another embodiment of the present invention.

FIG. 3 schematically illustrates a circuit diagram of the switching control circuit 12B in accordance with another embodiment of the present invention. In the example of FIG. 3, the output terminal of the comparison circuit 122 provides a control signal Ct1, and the switching control circuit 12B further comprises a flip-flop 126 and a selection circuit 124. The flip-flop 126 comprises a set terminal S, a reset terminal R, and an output terminal Q. The set terminal S receives the clock signal CLK, the reset terminal R is coupled to the comparison circuit 122 to receive the control signal Ct1, and the output terminal Q provides a control signal Ct2. The selection circuit 124 is coupled to the comparison circuit 122 and the flip-flop 126 to provide the switching control signal PWM based on the control signal Ct1 and the control signal Ct2.

In one embodiment, the selection circuit 124 receives a mode indication signal SSOK. In one example, when the mode indication signal SSOK is in a first status (e.g., logic low), it is indicated that the switching converter 100 is in the first mode, and when the mode indication signal SSOK is in a second status (e.g., logic high), it is indicated that the switching converter 100 is in the second mode. In some examples, a voltage level between a high threshold voltage (e.g., 2V) and a voltage source (e.g., 3.3V) is considered as logic high ("1"), a voltage level between zero voltage (0 V) and a low threshold voltage (e.g., 1V) is considered as logic low ("0"). In one embodiment, when the mode indication signal SSOK is in the first status, the selection circuit 124 selects the control signal Ct1 as the switching control signal PWM, and when the mode indication signal SSOK is in the second status, the selection circuit 124 selects the control signal Ct2 as the switching control signal PWM. In one embodiment, the switching control circuit 12 further comprises a logic circuit 125. For example, the logic circuit 125 comprises a NOR gate. The logic circuit 125 has a first input terminal to receive the mode indication signal SSOK, a second input terminal to receive an inverted signal of the switching control signal PWM, and an output terminal to provide the selection signal Sel based on the mode indication signal SSOK and the inverted signal of the switching control signal PWM. In one embodiment, when the switching circuit 100 is in the second mode, the selection circuit 121 selects the lower hysteresis limit Vthl as the current reference signal Iref, and the comparison circuit 122 provides the control signal Ct1 to turn the main switch OFF by comparing the current sense signal Vcs with the lower hysteresis limit Vthl. In another embodiment, when the switching circuit 100 is in the second mode, the selection circuit 121 selects the upper hysteresis limit Vthh as the current reference signal Iref, and the comparison circuit 122 provides the control signal Ct1 to turn the main switch OFF by comparing the current sense signal Vcs with the upper hysteresis limit Vthh. In one embodiment, when the switching circuit 100 is in the first mode and the main switch remains OFF under the control of the switching control signal PWM, the selection circuit 121 selects the lower hysteresis limit Vthl as the current reference signal Iref, and the comparison circuit 122 turns the main switch ON by comparing the current sense signal Vcs with the lower hysteresis limit Vthl. In another embodiment, when the switching circuit 100 is in the first mode and the main switch remains ON under the control of the switching control signal PWM, the selection circuit 121 selects the upper hysteresis limit Vthh as the current reference signal Iref, and the comparison circuit 122 turns the main switch OFF by comparing the current sense signal Vcs with the upper hysteresis limit Vthh.

Figure 4:
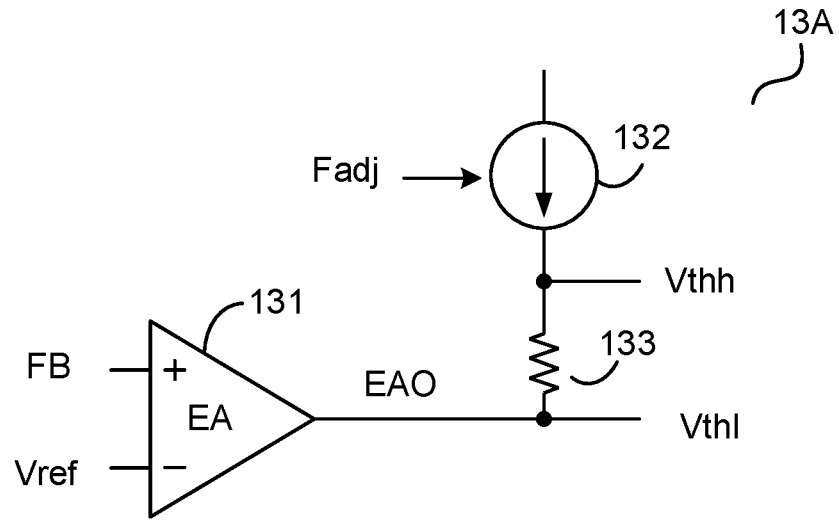
FIG. 4 schematically illustrates a circuit diagram of a hysteresis generating circuit 13A in accordance with an embodiment of the present invention.

FIG. 4 schematically illustrates a circuit diagram of the hysteresis generating circuit 13A in accordance with an embodiment of the present invention. As shown in FIG. 4, the hysteresis generating circuit 13A comprises an error circuit 131, a controllable current source 132, and a resistor 133. In the example of FIG. 4, the error circuit 131 comprises an error amplifier. The error circuit 131 has a first input terminal, a second input terminal, and an output terminal. The first input terminal of the error circuit 131 receives the feedback signal FB, the second input terminal of the error circuit 131 receives a voltage reference Vref, and the error circuit 131 provides an error signal EAO at its output terminal based on a difference between the feedback signal FB and the voltage reference Vref. In the example of FIG. 4, the error signal EAO is provided as the lower hysteresis limit Vthl. An output current of the controllable current source 132 is adjusted under the control of the hysteresis adjustment signal Fadj based on a difference between the frequency of the switching control signal PWM and the frequency of the clock signal CLK. The resistor 133 comprises a first terminal coupled to the output terminal of the error circuit 131, and a second terminal coupled to the controllable current source 132. The output current of the controllable current source 132 flows through the resistor 133, and the upper hysteresis limit Vthh is provided at the second terminal of the resistor 133.

Figure 5:
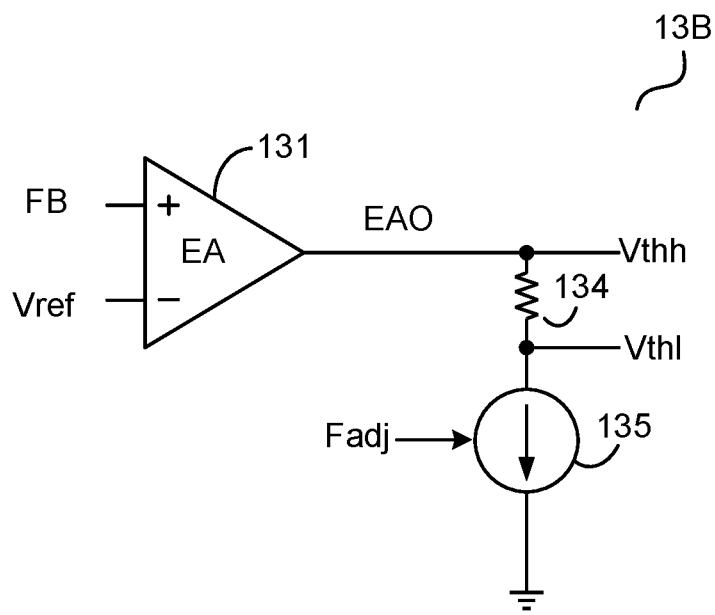
FIG. 5 schematically illustrates a circuit diagram of the hysteresis generating circuit 13B in accordance with another embodiment of the present invention.

FIG. 5 schematically illustrates a circuit diagram of the hysteresis generating circuit 13B in accordance with another embodiment of the present invention. In the example of FIG. 5, the hysteresis generating circuit 13B comprises the error circuit 131, a controllable current source 135, and a resistor 134. As shown in FIG. 5, the error signal EAO is provided as the upper hysteresis limit Vthh. An output current of the controllable current source 135 is adjusted under the control of the hysteresis adjustment signal Fadj based on a difference between the frequency of the switching control signal PWM and the frequency of the clock signal CLK. The resistor 134 comprises a first terminal coupled to the output terminal of the error circuit 131, and a second terminal coupled to the controllable current source 135. The output current of the controllable current source 135 flows through the resistor 134, and the lower hysteresis limit Vthl is provided at the second terminal of the resistor 134.

In the embodiments of the present invention, one of the upper hysteresis limit Vthh and the lower hysteresis limit Vthl is adjusted such that a difference between the upper hysteresis limit Vthh and the lower hysteresis limit Vthl is adjusted according to the frequency of the switching control signal PWM.

Figure 6:
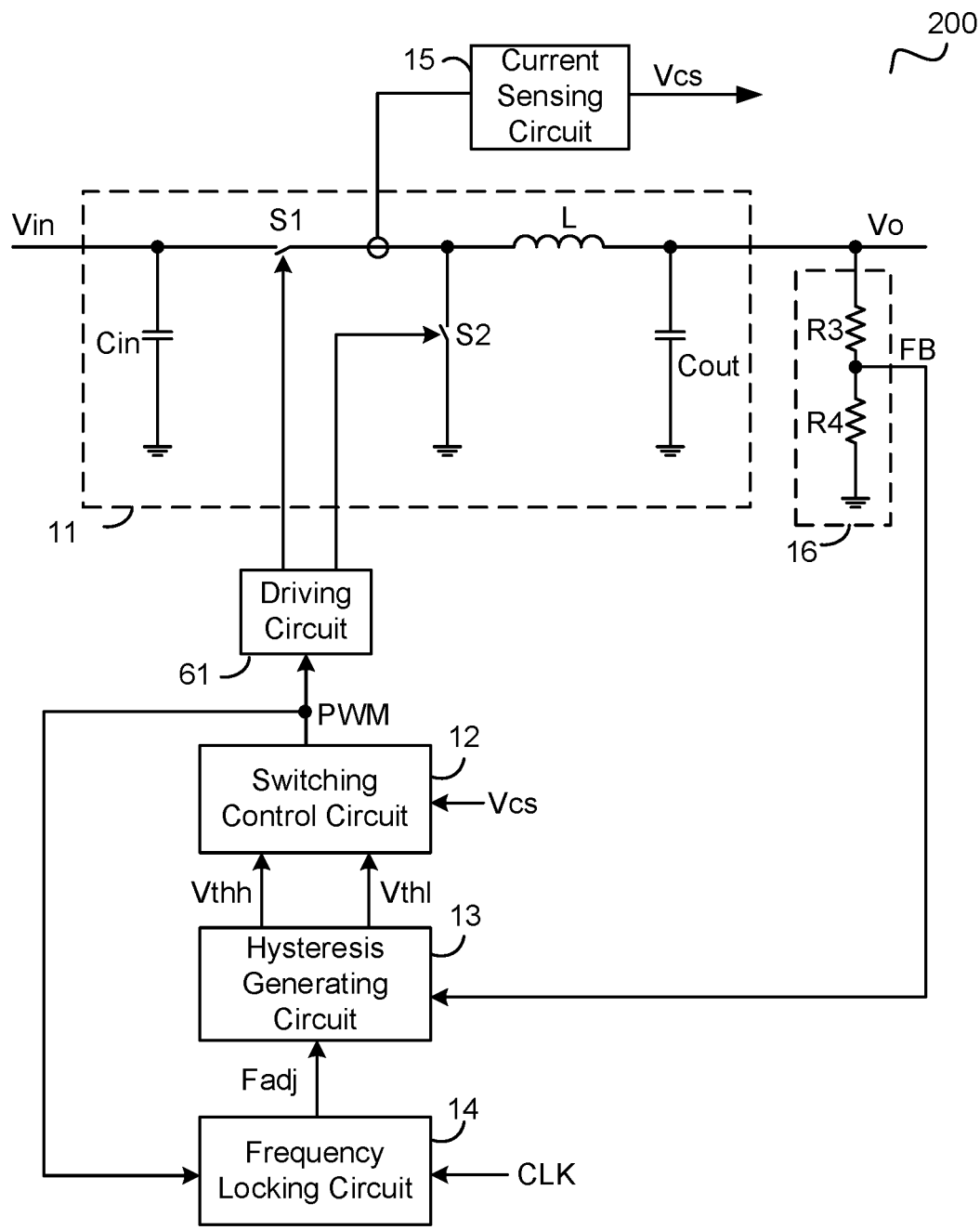
FIG. 6 schematically illustrates a circuit diagram of the switching converter 200 in accordance with an embodiment of the present invention.

FIG. 6 schematically illustrates a circuit diagram of the switching converter 200 in accordance with an embodiment of the present invention. In the example of FIG. 6, the switching converter 100 is a synchronous buck circuit comprising an input capacitor Cin, switches S1 and S2, an inductor L, and an output capacitor Cout, which are connected as shown in FIG. 6. For example, the main switch of the switching converter 100 may comprise the switch S1 or the switch S2. The feedback circuit 16 comprises a resistor a resistor R3 and a resistor R4 working as a resistor divider. The current sensing circuit 15 senses a current flowing through the switch S1 to provide the current sense signal Vcs. One with ordinary skill in the art should understand that the current sense signal Vcs may also be provided by sensing a current flowing through the switch S2. The switching control signal PWM controls the switches S1 and S2 through a driving circuit 61.

Figure 7:
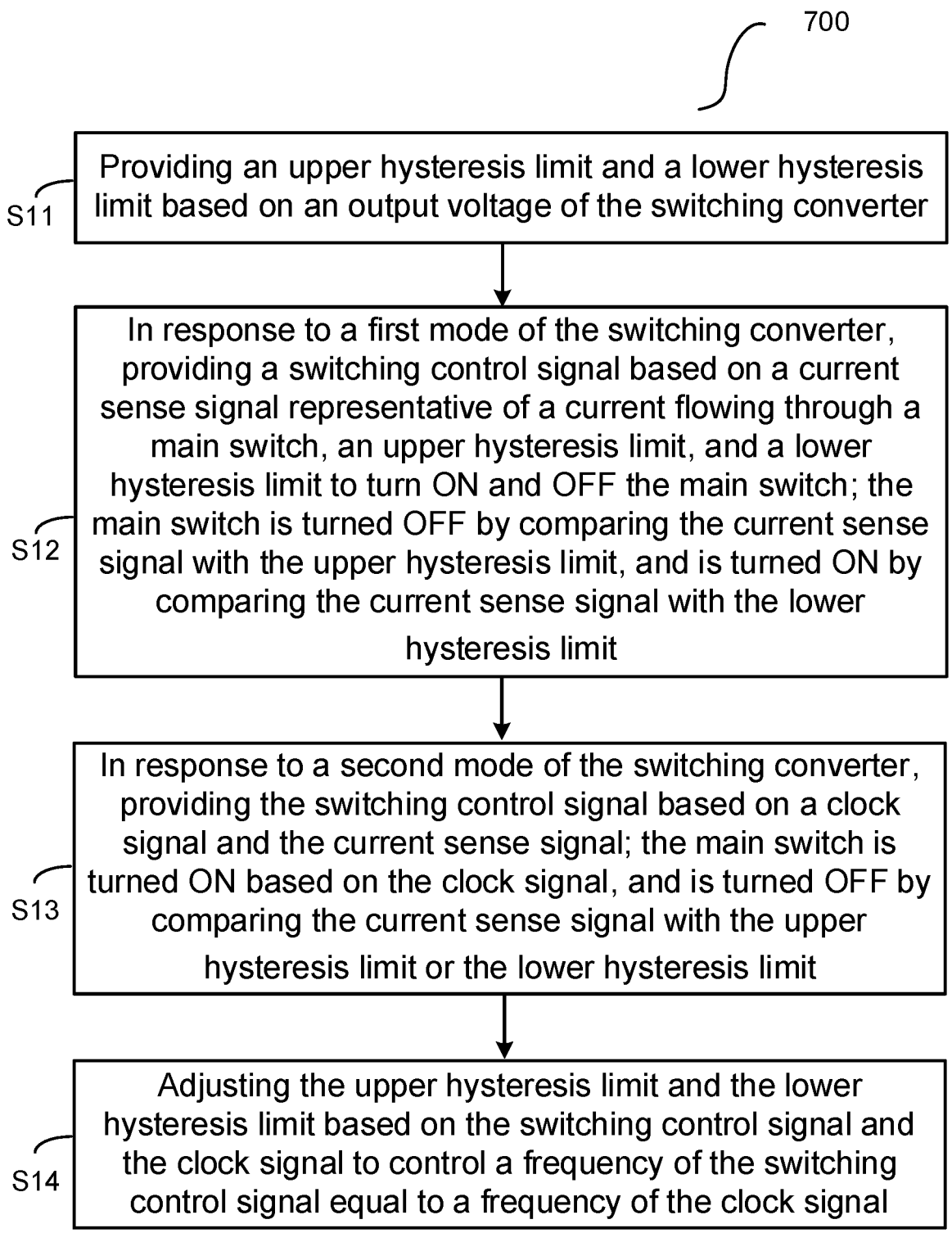
FIG. 7 illustrates a control method 700 for a switching converter in accordance with an embodiment of the present invention.

FIG. 7 illustrates a control method 700 for a switching converter in accordance with an embodiment of the present invention. The control method 700 comprises steps S11-S14.

In step S11, providing an upper hysteresis limit and a lower hysteresis limit based on an output voltage of the switching converter.

In step S12, in response to a first mode of the switching converter, providing a switching control signal based on a current sense signal representative of a current flowing through a main switch, an upper hysteresis limit, and a lower hysteresis limit to turn ON and OFF the main switch. The main switch is turned OFF by comparing the current sense signal with the upper hysteresis limit, and is turned ON by comparing the current sense signal with the lower hysteresis limit.

In step S13, in response to a second mode of the switching converter, providing the switching control signal based on a clock signal and the current sense signal. The main switch is turned ON based on the clock signal, and is turned OFF by comparing the current sense signal with the upper hysteresis limit or the lower hysteresis limit.

In step S14, adjusting one of the upper hysteresis limit and the lower hysteresis limit based on the switching control signal and the clock signal to control a frequency of the switching control signal equal to a frequency of the clock signal. Wherein one of the upper hysteresis limit and the lower hysteresis limit is adjusted such that a difference between the upper hysteresis limit and the lower hysteresis limit is adjusted according to the frequency of the switching control signal.

Note that in the control method described above, the functions indicated in the boxes can also occur in a different order than those shown in FIG. 7. For example, two boxes presented one after another can actually be executed essentially at the same time, or sometimes in reverse order, depending on the specific functionality involved.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

The invention claimed is:

1. A controller for a switching converter, wherein the switching converter comprises a main switch, the controller comprising:
   a hysteresis generating circuit, configured to provide an upper hysteresis limit and a lower hysteresis limit based on an output voltage of the switching converter;
   a switching control circuit, configured to provide a switching control signal to control the main switch; and
   a frequency locking circuit, configured to adjust one of the upper hysteresis limit and the lower hysteresis limit based on the switching control signal and a clock signal; wherein
   in response to a first mode of the switching converter, the switching control circuit is configured to turn the main switch ON by comparing a current sense signal representative of a current flowing through the main switch with the lower hysteresis limit, and to turn the main switch OFF by comparing the current sense signal with the upper hysteresis limit; and wherein
   in response to a second mode of the switching converter, the switching control circuit is configured to turn the main switch ON based on the clock signal, and to turn the main switch OFF based on the current sense signal.

2. The controller of claim 1, wherein the frequency locking circuit is configured to adjust one of the upper hysteresis limit and the lower hysteresis limit based on a difference between a frequency of the switching control signal and a frequency of the clock signal.

3. The controller of claim 1, wherein the hysteresis generating circuit further comprises:
   an error circuit, having an output terminal to provide an error signal as the upper hysteresis limit based on a difference between a feedback signal and a voltage reference, wherein the feedback signal represents the output voltage;
   a controllable current source, configured to provide an output current, and is further configured to adjust the output current based on a difference between a frequency of the switching control signal and a frequency of the clock signal; and
   a resistor, comprising a first terminal and a second terminal, wherein the first terminal of the resistor is coupled to the output terminal of the error circuit, the second terminal of the resistor is coupled to the controllable current source, and the lower hysteresis limit is provided at the second terminal of the resistor.

4. The controller of claim 1, wherein the hysteresis generating circuit further comprises:
   an error circuit, having an output terminal to provide an error signal as the lower hysteresis limit based on a difference between a feedback signal and a voltage reference, wherein the feedback signal represents the output voltage;
   a controllable current source, configured to provide an output current, and is further configured to adjust the output current based on a difference between a frequency of the switching control signal and a frequency of the clock signal; and
   a resistor, comprising a first terminal and a second terminal, wherein the first terminal of the resistor is coupled to the output terminal of the error circuit, the second terminal of the resistor is coupled to the controllable current source, and the upper hysteresis limit is provided at the second terminal of the resistor.

5. The controller of claim 1, wherein the switching control circuit further comprises:
   a comparison circuit, configured to provide the switching control signal based on the current sense signal, the upper hysteresis limit, and the lower hysteresis limit, wherein the comparison circuit is configured to turn the main switch OFF by comparing the current sense signal with the upper hysteresis limit, and is configured to turn the main switch ON by comparing the current sense signal with the lower hysteresis limit.

6. The controller of claim 1, wherein the switching control circuit further comprises:
   a comparison circuit, configured to provide a first control signal based on the current sense signal, the upper hysteresis limit, and the lower hysteresis limit;

a flip-flop, having a set terminal to receive the clock signal, a reset terminal to receive the first control signal, and an output terminal to provide a second control signal; and a selection circuit, configured to provide the switching control signal based on the first control signal and the second control signal; wherein in response to the first mode of the switching converter, the selection circuit is configured to select the first control signal as the switching control signal, and in response to the second mode of the switching converter, the selection circuit is configured to select the second control signal as the switching control signal.

7. The controller of claim 6, wherein in response to the first mode of the switching converter, the selection circuit is configured to provide the switching control signal by comparing the current sense signal with the upper hysteresis limit during when the main switch remains ON.

8. The controller of claim 6, wherein in response to the first mode of the switching converter, the selection circuit is configured to provide the switching control signal by comparing the current sense signal with the lower hysteresis limit during when the main switch remains OFF.

9. The controller of claim 1, wherein in response to the second mode of the switching converter, the switching control circuit is configured to turn the main switch OFF by comparing the current sense signal with one of the upper hysteresis limit and the lower hysteresis limit.

10. The controller of claim 1, wherein one of the upper hysteresis limit and the lower hysteresis limit is adjusted such that a difference between the upper hysteresis limit and the lower hysteresis limit is adjusted according to a frequency of the switching control signal.

11. A controller for a switching converter, wherein the switching converter comprises a main switch, the controller comprising:

a hysteresis generating circuit, configured to provide an upper hysteresis limit and a lower hysteresis limit based on an output voltage of the switching converter; and a switching control circuit coupled to the hysteresis generating circuit, configured to provide a switching control signal based on a current sense signal representative of a current flowing through the main switch, the upper hysteresis limit, and the lower hysteresis limit to turn ON and OFF the main switch; wherein in response to a first mode of the switching converter, the switching control circuit is configured to turn the main switch OFF by comparing the current sense signal with the upper hysteresis limit, and to turn the main switch ON by comparing the current sense signal with the lower hysteresis limit; and wherein one of the upper hysteresis limit and the lower hysteresis limit is adjusted such that a difference between the upper hysteresis limit and the lower hysteresis limit is adjusted according to a frequency of the switching control signal.

12. The controller of claim 11, wherein in response to a second mode of the switching converter, the switching control circuit is configured to turn the main switch ON based on a clock signal, and to turn the main switch OFF based on comparing the current sense signal with one of the upper hysteresis limit and the lower hysteresis limit.

13. The controller of claim 12, wherein one of the upper hysteresis limit and the lower hysteresis limit is adjusted based on a difference between the frequency of the switching control signal and a frequency of the clock signal.

14. The controller of claim 11, wherein the hysteresis generating circuit further comprises:

an error circuit, having an output terminal to provide an error signal as the upper hysteresis limit based on a difference between a feedback signal and a voltage reference, wherein the feedback signal represents the output voltage;

a controllable current source, configured to provide an output current, and is further configured to adjust the output current based on a difference between the frequency of the switching control signal and a frequency of the clock signal; and a resistor, comprising a first terminal and a second terminal, wherein the first terminal of the resistor is coupled to the output terminal of the error circuit, the second terminal of the resistor is coupled to the controllable current source, and the lower hysteresis limit is provided at the second terminal of the resistor.

15. The controller of claim 11, wherein the hysteresis generating circuit further comprises:

an error circuit, having an output terminal to provide an error signal as the lower hysteresis limit based on a difference between a feedback signal and a voltage reference, wherein the feedback signal represents the output voltage;

a controllable current source, configured to provide an output current, and is further configured to adjust the output current based on a difference between the frequency of the switching control signal and a frequency of the clock signal; and a resistor, comprising a first terminal and a second terminal, wherein the first terminal of the resistor is coupled to the output terminal of the error circuit, the second terminal of the resistor is coupled to the controllable current source, and the upper hysteresis limit is provided at the second terminal of the resistor.

16. A control method for a switching converter, wherein the switching converter comprises a main switch, the control method comprising:

providing an upper hysteresis limit and a lower hysteresis limit based on an output voltage of the switching converter;

in response to a first mode of the switching converter, providing a switching control signal based on a current sense signal representative of a current flowing through the main switch, the upper hysteresis limit, and the lower hysteresis limit to turn ON and OFF the main switch, wherein the main switch is turned OFF by comparing the current sense signal with the upper hysteresis limit, and is turned ON by comparing the current sense signal with the lower hysteresis limit; and adjusting one of the upper hysteresis limit and the lower hysteresis limit based on the switching control signal.

17. The control method of claim 16, further comprising:

in response to a second mode of the switching converter, providing the switching control signal based on a clock signal and the current sense signal, wherein the main switch is turned ON based on the clock signal, and is turned OFF by comparing the current sense signal with one of the upper hysteresis limit and the lower hysteresis limit.

18. The control method of claim 16, wherein adjusting one of the upper hysteresis limit or the lower hysteresis limit based on the switching control signal further comprises:

adjusting one of the upper hysteresis limit and the lower hysteresis limit based on a difference between a frequency of the switching control signal and a frequency of a clock signal.

19. The control method of claim 16, further comprising:
controlling a frequency of the switching control signal equal to a frequency of the clock signal by adjusting one of the upper hysteresis limit and the lower hysteresis limit.

* * * * *